(12) United States Patent
Jung

(10) Patent No.: US 7,147,994 B2
(45) Date of Patent: *Dec. 12, 2006

(54) TOP ARC POLYMERS, METHOD OF PREPARATION THEREOF AND TOP ARC COMPOSITIONS COMPRISING THE SAME

(75) Inventor: Jae-chang Jung, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 45 days.

This patent is subject to a terminal disclaimer.

(21) Appl. No.: 11/032,971

(22) Filed: Jan. 11, 2005

(65) Prior Publication Data

US 2005/0239296 A1    Oct. 27, 2005

(30) Foreign Application Priority Data

Apr. 27, 2004  (KR) .................. 10-2004-0029087

(51) Int. Cl.
*G03F 7/11*  (2006.01)
*G03F 7/20*  (2006.01)

(52) U.S. Cl. .................. 430/325; 430/326; 430/273.1; 430/330; 430/327; 526/318.42

(58) Field of Classification Search ............ None
See application file for complete search history.

(56) References Cited

U.S. PATENT DOCUMENTS

| | | | | |
|---|---|---|---|---|
| 4,510,284 | A * | 4/1985 | Gimpel et al. ......... | 524/379 |
| 5,614,590 | A * | 3/1997 | Bederke et al. ........ | 525/127 |
| 6,165,684 | A | 12/2000 | Mizutani et al. | |
| 6,399,269 | B1 | 6/2002 | Mizutani et al. | |
| 2001/0003030 | A1 * | 6/2001 | Jung et al. ............ | 430/273.1 |

(Continued)

OTHER PUBLICATIONS

Smith et al, "Water immersion optical lithography at 193 nm", J. microlithl, Microfab., Microsyst. vol. 3, No. 1, Jan. 2004, pp. 44-51.*

*Primary Examiner*—Cynthia Hamilton
(74) *Attorney, Agent, or Firm*—Marshall, Gerstein & Borun LLP

(57) ABSTRACT

Disclosed herein are a top anti-reflective coating polymer used in a photolithography process, a method for preparing the anti-reflective coating polymer, and an anti-reflective coating composition comprising the anti-reflective coating polymer. The disclosed top anti-reflective coating polymer is used in immersion lithography for the fabrication of a sub-50 nm semiconductor device. The top anti-reflective coating polymer is represented by Formula 1 below:

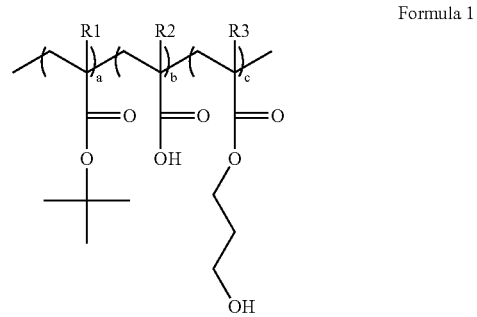

Formula 1 wherein R1, R2 and R3 are independently hydrogen or a methyl group; and a, b and c represent the mole fraction of each monomer, and are in the range between 0.05 and 0.9. The top anti-reflective coating formed using the anti-reflective coating polymer is not soluble in water and can be applied to immersion lithography using water as a medium for a light source. Since the disclosed top anti-reflective coating can reduce the reflectance from an underlayer, the uniformity of CD is improved, thus enabling the formation of an ultrafine pattern.

7 Claims, 1 Drawing Sheet

U.S. PATENT DOCUMENTS

2004/0224525 A1*  11/2004  Endo et al. .................. 438/745
2005/0007570 A1*  1/2005   Streefkerk et al. ............ 355/30
2005/0036184 A1*  2/2005   Yeo et al. ..................... 359/15
2005/0123863 A1*  6/2005   Chang et al. ................ 430/322
2005/0147920 A1*  7/2005   Lin et al. ..................... 430/311
2005/0202351 A1*  9/2005   Houlihan et al. ............ 430/322

* cited by examiner

TOP ARC POLYMERS, METHOD OF PREPARATION THEREOF AND TOP ARC COMPOSITIONS COMPRISING THE SAME

BACKGROUND

1. Technical Field

An anti-reflective coating (ARC) polymer used in a photolithography process, a method for preparing the disclosed anti-reflective coating polymer, and an anti-reflective coating composition comprising the anti-reflective coating polymer are also disclosed. The disclosed anti-reflective coating polymer usable in immersion lithography for the fabrication of a sub-50 nm semiconductor device.

2. Description of the Related Art

Photolithography processes are processes for the transfer of a semiconductor circuit pattern from a photomask to a wafer. They are one of the most important steps in determining the size and integration density of circuits of semiconductor devices.

In recent years, as the integration density of semiconductor devices has increased, new techniques have been developed for the fine processing required to fabricate the more dense semiconductor devices. Thus, there is an increasing need for fine processing techniques for photolithography processes. As the circuit linewidths are reduced, the use of short-wavelength light sources for illumination, such as KrF, ArF, $F_2$ and EUV excimer lasers, and high numerical aperture lenses is required. EUV, $F_2$, ArF and KrF lasers are preferentially used as light sources for their short wavelengths.

A number of studies on the development of sub-50 nm devices have been undertaken. In response to these studies, recent attention has been directed toward the development of suitable processing equipment and materials associated with the use of $F_2$ and EUV as exposure light sources. Some technical solutions for the use of F2 are satisfactory to some extent, but there are the following problems: 1) the efficient mass production of high-quality CaF2 within a short time is limited, 2) since soft pellicles are likely to be deformed upon exposure to light at 157 nm, the storage stability is decreased, and 3) hard pellicles incur considerable production cost, and are difficult to produce on a commercial scale due to their nature of light refraction.

On the other hand, since suitable light sources, exposure equipment and masks are required to use an EUV laser, it is not yet suitable for practical use. Accordingly, the formation of finer high-precision photoresist patterns by using a photoresist adapted to the use of an ArF excimer laser has now become a key technical task. Under these circumstances, immersion lithography has recently drawn attention.

Dry lithography is a currently used lithography process, and is an exposure system where air is present between the exposure lens and the wafer. In contrast to dry lithography, immersion lithography, which corresponds to the numerical aperture (NA) scaling technique, is an exposure system wherein water is filled between an exposure lens and a wafer. Since water (refractive index (n)=1.4) is used as a medium for a light source in the immersion lithography, the NA is 1.4 times larger than that in the dry lithography using air (refractive index (n)=1.0). Accordingly, immersion lithography is advantageous because of the high resolution.

A problem encountered with the fabrication of a sub-50 nm semiconductor device is that an alteration in the critical dimension (CD) of a photoresist pattern inevitably takes place. During the process for the formation of an ultrafine pattern by standing waves, reflective notching diffracted light and reflected light from an underlayer can cause variation in the thickness of the photoresist. To prevent the reflected light from the underlayer, a light-absorbing material, called an "anti-reflective coating" is used between the underlayer and the photoresist. A bottom anti-reflective coating is between the underlayer and the photoresist layer. With the recent increase in the fineness of overlying photoresist patterns, a top anti-reflective coating (TARC) has also been used to prevent the photoresist pattern from being disrupted by the reflected and diffracted light. As the remarkable miniaturization of semiconductor devices makes overlying photoresist patterns increasingly fine, the use of a bottom anti-reflective coating only cannot completely prevent the patterns from being disrupted by scattered reflection. Accordingly, a top anti-reflective coating is used to prevent the disruption of the patterns.

However, since conventional top anti-reflective coatings for use in dry lithography are water-soluble (in the case of using KrF or ArF laser), they cannot be used in immersion lithography because water is used as a medium for a light source in immersion lithography.

Accordingly, an ideal top anti-reflective coating for use in immersion lithography must satisfy the following requirements: (1) the top anti-reflective coating must be transparent to a light source; (2) the top anti-reflective coating must have a refractive index between 1.4 and 2.0, depending on the kind of an underlying photosensitive film (i.e. photoresist) to be used; (3) when the top anti-reflective coating composition is coated on an underlying photosensitive film, it must not dissolve the photosensitive film; (4) the top anti-reflective coating must not be soluble in water upon light exposure; and (5) the top anti-reflective coating must be soluble in a developing solution.

The above-mentioned requirements make the development of a suitable top anti-reflective coating for use in immersion lithography very difficult. Thus, a strong need exists for the development of a top anti-reflective coating for use in immersion lithography which is water-insoluble and can minimize the alteration of the critical dimension (CD).

SUMMARY OF THE DISCLOSURE

In view of the above problems, top anti-reflective coating polymers are disclosed which can be used in immersion lithography due to their water insolubility, which can prevent the multiple interference of light inside a photoresist in the formation of a photoresist pattern, and which can inhibit the alteration in the dimensions of the photoresist pattern resulting from the variation in the thickness of the photoresist.

A method for preparing the disclosed top anti-reflective coating polymers is also disclosed.

A top anti-reflective coating composition comprising the disclosed top anti-reflective coating polymer is also disclosed.

A method for forming a pattern by using the disclosed top anti-reflective coating composition is also disclosed.

The disclosed top anti-reflective coating polymers have a weight-average molecular weight of 1,000–1,000,000, and are represented by Formula 1:

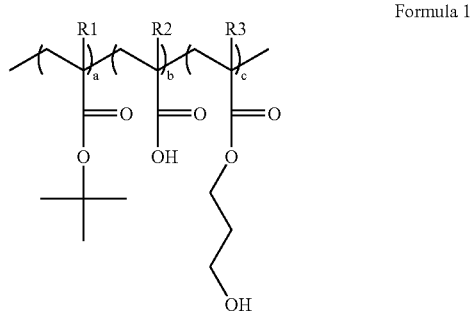

Formula 1 wherein R1, R2 and R3 are independently hydrogen or a methyl group; and a, b and c represent the mole fraction of each monomer, and are in the range between 0.05 and 0.9.

The top anti-reflective coating polymers exhibit high light transmission, and thus are suitable for use as a top anti-reflective coating. In addition, since the top anti-reflective coating polymers are highly soluble in a developing solution after light exposure, they have no effect on the formation of a pattern. Furthermore, since the disclosed top anti-reflective coating polymers are water-insoluble, they can be used in immersion lithography. Moreover, since the disclosed top anti-reflective coating polymer can prevent scattered reflection from the top of a photoresist, they can effectively prevent a photoresist pattern from being disrupted by the scattered reflection.

Considering the physical properties, including solubility and reflective index, the disclosed top anti-reflective coating polymers have a weight-average molecular weight in the range of 1,000–1,000,000, and preferably in the range of 2,000–10,000. Too high a molecular weight causes a decrease in the solubility in a developing solution. As a result, a portion of the anti-reflective coating remains on the photoresist after development, causing contamination of the pattern. On the other hand, too low a molecular weight cannot ensure optimized reflective index of the anti-reflective coating and good overcoating on the photoresist.

The t-butylacrylate-acrylic acid-3-hydroxypropyl-methacrylate copolymer represented by Formula 1 can be prepared by dissolving a t-butylacrylate monomer, an acrylic acid monomer and a 3-hydroxypropylmethacrylate monomer in an organic solvent, adding a polymerization initiator to the solution, and subjecting the mixture to free-radical polymerization at a temperature in the range of 55° C.–65° C. for a time period in the range of 6–12 hours.

Any organic solvent that can be used in free-radical copolymerization can be used in the disclosed preparation method. Preferably, the organic solvent is selected from the group consisting of propyleneglycolmethylether acetate (PGMEA), tetrahydrofuran, cyclohexanone, dimethylformamide, dimethylsulfoxide, dioxane, methyl ethyl ketone, ethylacetate, benzene, toluene, xylene, and mixtures thereof. PGMEA is more preferred.

Further, the polymerization initiator is preferably selected from the group consisting of 2,2'-azobisisobutyronitrile (AIBN), benzoylperoxide, acetylperoxide, laurylperoxide, t-butylperacetate, t-butylhydroperoxide and di-t-butylperoxide. The use of 2,2'-azobisisobutyronitrile (AIBN) is more preferred.

In another aspect, disclosed top anti-reflective coatings comprise an effective amount of a top anti-reflective coating polymer with a weight-average molecular weight in the range of 1,000–1,000,000, and are represented by Formula 1:

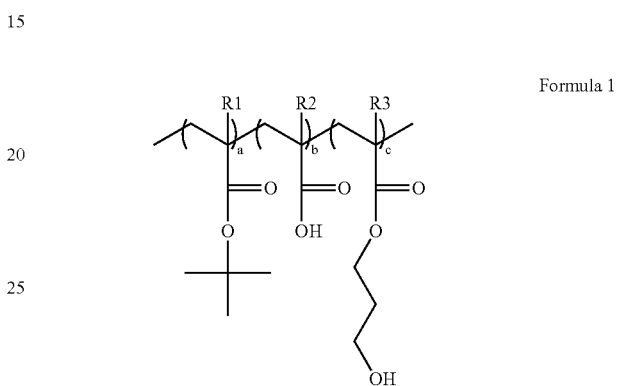

Formula 1 wherein R1, R2 and R3 are independently hydrogen or a methyl group; and a, b and c represent the mole fraction of each monomer, and are in the range of 0.05 and 0.9.

The top anti-reflective coating compositions are prepared by dissolving the top anti-reflective coating polymer in n-butanol. The top anti-reflective coating compositions have an optimal reflective index in the range of 1.4 to 2.0. Accordingly, when the top anti-reflective coating compositions are overcoated on top of a photoresist, the reflectance can be minimized and thus the photoresist pattern can be protected from being disrupted by reflected light.

Considering the reflective index and thickness of the anti-reflective coating composition, the n-butanol is preferably added in an amount in the range of 1,000–10,000 wt %, based on the weight of the polymer of Formula 1. If the amount of the n-butanol is outside this range, the reflective index of the anti-reflective coating falls outside the range of 1.4~2.0 and the thickness of the anti-reflective coating cannot be optimized.

If desired, the disclosed top anti-reflective coating composition may further comprise 1–20 wt % of L-proline, based on the weight of the polymer of Formula 1. The L-proline acts to further inhibit the diffusion of an acid toward the unexposed region.

In another aspect, a disclosed method for forming a pattern of a semiconductor device comprises: (a) applying a photoresist to a semiconductor substrate on which a particular structure has been previously formed; (b) applying the top anti-reflective coating composition on top of the photoresist, and baking to form a top anti-reflective coating; and (c) exposing the photoresist to light, and developing the exposed photoresist to form a photoresist pattern.

The pattern formation method according to the present invention is characterized in that the anti-reflective coating formed on top of the photoresist is formed of the top anti-reflective coating composition of the present invention. Since the top anti-reflective coating thus prepared has a reflective index of 1.4 to 2.0, the reflectance at the top of the photoresist can be minimized. Accordingly, the photoresist pattern formed by the disclosed methods have improved pattern uniformity.

The baking is preferably carried out at a temperature in the range of 70° C.~200° C.

The disclosed anti-reflective coating compositions and the pattern formation methods are primarily applied to processes for forming an ultrafine pattern using an ArF light source (193 nm). Likewise, they can be applied to processes for forming an ultrafine pattern using a light source (e.g., F2 or EUV) having a shorter wavelength, so long as water can be used as a medium for the light source. The exposure using the light source is preferably achieved with an exposure energy in the range of 0.1 to 50 mJ/cm$^2$.

In the disclosed pattern formation method, the developing can be carried out by using an alkaline developing solution. In a particularly preferred alkaline developing solution, a 0.01–5% (w/w) solution of tetramethylammoniumhydroxide (TMAH) is preferably used.

Since the disclosed top anti-reflective coating composition can minimize scattered reflection, it can be applied to various processes for fabricating semiconductor devices, in addition to the formation process of an ultrafine pattern.

It can be appreciated that the disclosed top anti-reflective coating composition can be applied to a variety of processes in ways obvious to those skilled in the art, depending on the type of the processes. Accordingly, the detailed explanations concerning the application of the anti-reflective coating composition to the fabrication of semiconductor devices are omitted.

BRIEF DESCRIPTION OF THE DRAWINGS

The above and other features and advantages of the disclosed top ARC polymers will be more clearly understood from the following detailed description taken in conjunction with the accompanying drawing, wherein.

DETAILED DESCRIPTION OF THE PRESENTLY PREFERRED EMBODIMENTS

Figure 1:
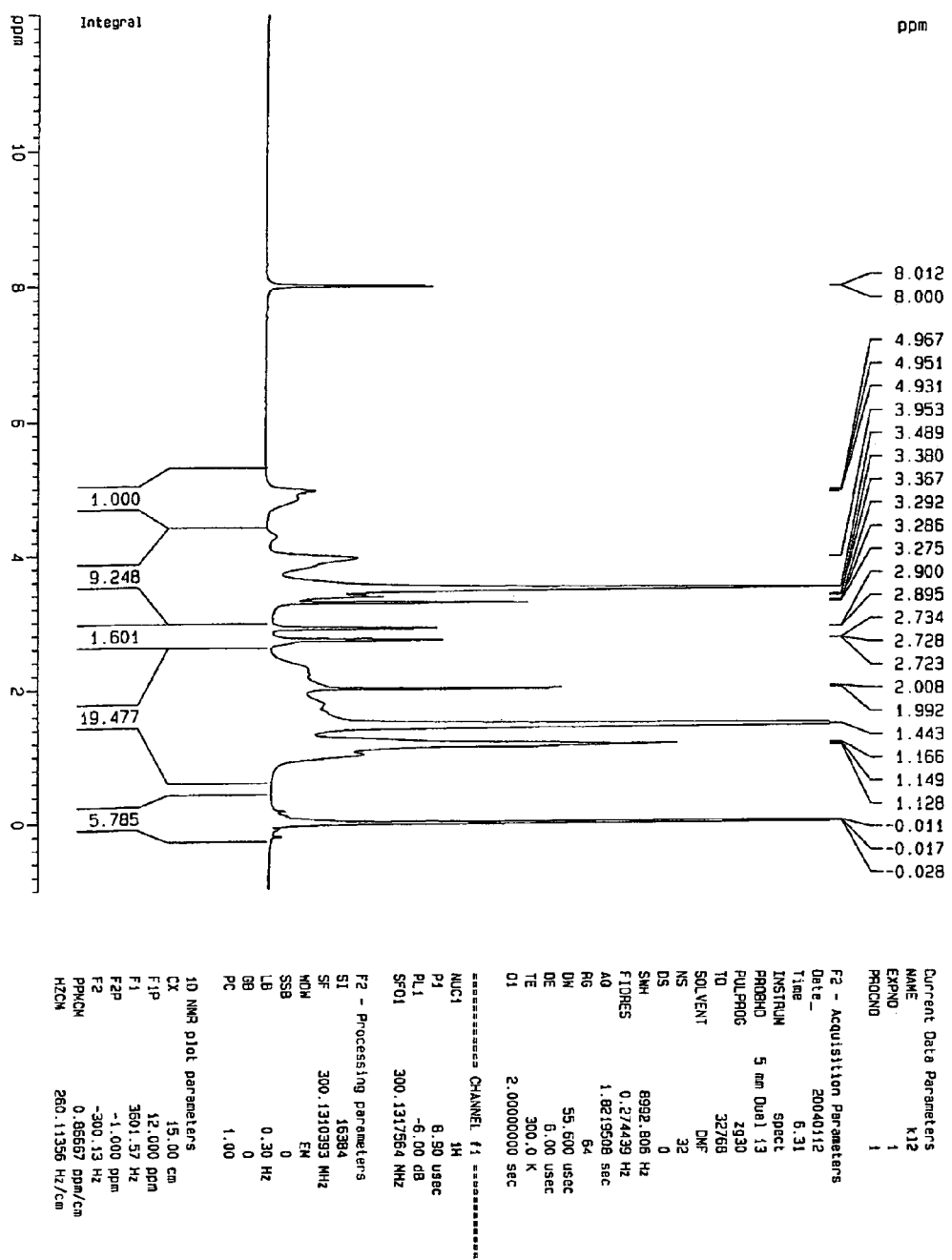
FIG. 1 is a 1H-NMR spectrum of the top anti-reflective coating polymer prepared in Example 1 below.

The following examples are given for the purpose of illustration and are not to be construed as limiting the scope of this disclosure.

EXAMPLE 1

Preparation of Top Anti-Reflective Coating Polymer 10 g of t-butylacrylate, 4 g of acrylic acid, 6 g of 3-hydroxypropyl methacrylate and 0.4 g of AIBN were added to 200 g of PGMEA, and were then polymerized at 60° C. for 8 hours. After completion of the polymerization, the mixture was precipitated in ether, filtered, and dried in vacuo to yield 17 g of t-butyl acrylate-acrylic acid-3-hydroxypropyl methacrylate copolymer, as a white solid, represented by Formula 2 below:

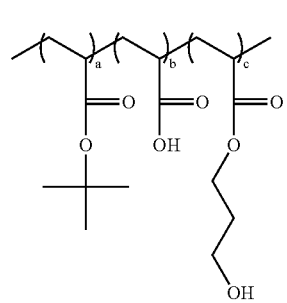

Formula 2 wherein a, b and c represent the mole fraction of each monomer, and are in the range between 0.05 and 0.9.

The structure of the copolymer was identified through 1H-NMR spectrum (FIG. 1).

EXAMPLE 2

Preparation of Top Anti-Reflective Coating Composition 2.5 g of the polymer prepared in Example 1, and 0.04 g of L-proline, which is an amino acid, were dissolved in 100 g of n-butanol to give a top anti-reflective coating composition for use in immersion lithography.

EXAMPLE 3

Formation of Anti-Reflective Coating

The top anti-reflective coating composition prepared in Example 2 was coated on a wafer at 2,000 rpm to form an anti-reflective coating. The thickness, light transmission (at 193 nm), and reflective index of the anti-reflective coating were shown to have 46.5 nm, 96%, and 1.62, respectively.

EXAMPLE 4

Formation of Top Anti-Reflective Coating

The top anti-reflective coating composition prepared in Example 2 was coated on a photosensitive film (AR1221J, JSR) having a thickness of 220 nm at 2,000 rpm to form a top anti-reflective coating having a thickness of 266.4 nm. It was confirmed that the top anti-reflective coating composition of the present invention does not dissolve the photosensitizer.

EXAMPLE 5

Water Solubility Test

The wafer on which the photoresist and the top anti-reflective coating were formed was immersed in liquid, distilled water for about 5 minutes, and dried. The resulting structure was measured to have a thickness of 266.7 nm, which is larger by about 0.3 nm than that before the immersion in water. This result reveals that the disclosed top anti-reflective coating compositions are neither dissolved nor swollen in water.

EXAMPLE 6

Solubility Test in Developing Solution

The wafer on which the photoresist and a disclosed top anti-reflective coating were formed was developed with a 2.38 (w/w) TMAH developing solution for about one minute, and washed with distilled water. The resulting structure was measured to have a thickness of 220 nm. This indicates that the top anti-reflective coating composition was completely dissolved by the developing solution.

As apparent from the above description, the top anti-reflective coatings formed using the disclosed anti-reflective coating polymers satisfy the following requirements for use in immersion lithography: (1) since the top anti-reflective coatings have a light transmission of 96% or higher, they are transparent to a light source; (2) the disclosed top anti-reflective coatings have a refractive index between 1.4 and 2.0; (3) the disclosed top anti-reflective coating compositions do not dissolve the photosensitive film; (4) the disclosed top anti-reflective coatings are not soluble in water upon light exposure; (5) the disclosed top anti-reflective coatings are highly soluble in a developing solution upon development.

Therefore, the disclosed top anti-reflective coatings can be applied to immersion lithography, and can reduce the reflectance at the top of the photoresist, thus minimizing the alteration of CD.

As a result, the disclosed top anti-reflective coatings enable the formation of a fine photoresist pattern, thus contributing to the fabrication of sub-50 nm semiconductor devices.

Although the preferred embodiments have been disclosed for illustrative purposes, those skilled in the art will appreciate that various modifications, additions and substitutions are possible, without departing from the scope and spirit of this disclosure or the accompanying claims.

What is claimed is:

1. A top anti-reflective coating composition comprising:
a top anti-reflective coating polymer having a weight-average molecular weight in the range of 1,000–1,000,000, and represented by Formula 1 below:

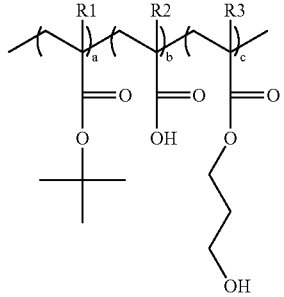

Formula 1 wherein R1, R2, and R3 are independently hydrogen or a methyl group; and a, b, and c represent the mole fraction of each monomer, and are each in the range of 0.05 and 0.9, and,
wherein the composition is prepared by dissolving the polymer in 1,000–10,000 wt % of n-butanol, based on the weight of the polymer.

2. A top anti-reflective coating composition comprising:
a top anti-reflective coating polymer having a weight-average molecular weight in the range of 1,000–1,000,000, and represented by Formula 1 below;

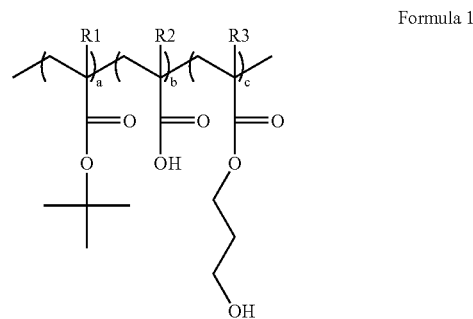

Formula 1 wherein R1, R2, and R3 are independently hydrogen or a methyl group; and a, b, and c represent the mole fraction of each monomer, and are each in the range of 0.05 and 0.9, and,
further comprising 1–20 wt % of L-proline, based on the weight of the polymer.

3. A method for forming a pattern of a semiconductor device, comprising:
(a) applying a photoresist to a semiconductor substrate;
(b) applying a top anti-reflective coating composition, a top anti-reflective coating polymer having a weight-average molecular weight in the range of 1,000–1,000,000, and represented by Formula 1 below;

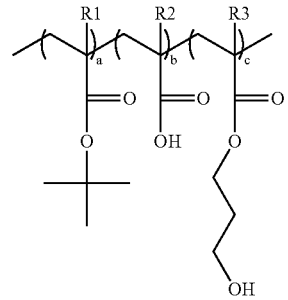

Formula 1 wherein R1, R2, and R3 are independently hydrogen or a methyl group; and a, b, and c represent the mole fraction of each monomer, and are each in the range of 0.05 and 0.9 on top of the photoresist, and baking the same to form a top anti-reflective coating; and
(c) exposing the photoresist to light, and developing the exposed photoresist to form a photoresist pattern.

4. The method according to claim 3, wherein the baking is carried out at a temperature in the range of 70° C.–200° C.

5. The method according to claim 3, wherein light is transmitted through a liquid in the exposure step.

6. The method according to claim 3, wherein light is transmitted through water in the exposure step.

7. The method according to claim 3, wherein the developing is carried out by using a 0.01~5 wt % solution of tetramethyl ammonium hydroxide (TMAH).

* * * * *